(12) United States Patent
Juhola

(10) Patent No.: US 7,501,695 B2
(45) Date of Patent: Mar. 10, 2009

(54) HIGH FREQUENCY INTEGRATED CIRCUIT (HFIC) MICROSYSTEMS ASSEMBLY AND METHOD FOR FABRICATING THE SAME

(76) Inventor: Tarja A. Juhola, Kaaritie 8, Kaipola (FI) 42220

( * ) Notice: Subject to any disclaimer, the term of this patent is extended or adjusted under 35 U.S.C. 154(b) by 654 days.

(21) Appl. No.: 10/472,795

(22) PCT Filed: Apr. 8, 2002

(86) PCT No.: PCT/FI02/00297

§ 371 (c)(1),
(2), (4) Date: Jan. 26, 2004

(87) PCT Pub. No.: WO02/082537

PCT Pub. Date: Oct. 17, 2002

(65) Prior Publication Data

US 2006/0208765 A1    Sep. 21, 2006

(51) Int. Cl.
*G01N 30/86* (2006.01)
(52) U.S. Cl. .................. 257/686; 257/688; 257/701
(58) Field of Classification Search .......... None
See application file for complete search history.

(56) References Cited

U.S. PATENT DOCUMENTS 4,494,083 A * 1/1985 Josefsson et al. .......... 333/33
5,830,301 A * 11/1998 Sturzebecher et al. ..... 156/89.16
6,903,700 B2 * 6/2005 Maruhashi et al. ........ 343/770

* cited by examiner

Primary Examiner—Leonardo Andújar

(57) ABSTRACT

High frequency integrated circuit (HFIC) microsystems assembly and method for fabricating the same are disclosed. Presented HFIC assembly method has the optimized structure for minimizing the losses in transmitting electronic and electromagnetic energy in interconnects; it optimizes the area used for interconnects and eliminates most hazardous materials from the assembly process making it an environmentally friendly alternative for IC assembly purposes. This versatile assembly process was developed specifically for HFIC packaging, but its versatility expands its usage from monolithic microwave integrated circuit (MMIC) packaging to partial PCB assemblies and due to environmental friendliness potentially replacing other PCB techniques especially in high performance applications. HFIC assembly comprises a first substrate (702, 703) and a second substrate (701) of conductor-on-insulator or similar having high aspect ratio trenches and conductors (705, 706, 707, 708) as well as a chip therebetween. A common ground (707, 708, 710, 710', 711, 711') formed by the first and second substrates encompass the chip at least adjacent the HF-signal paths (706).

32 Claims, 14 Drawing Sheets

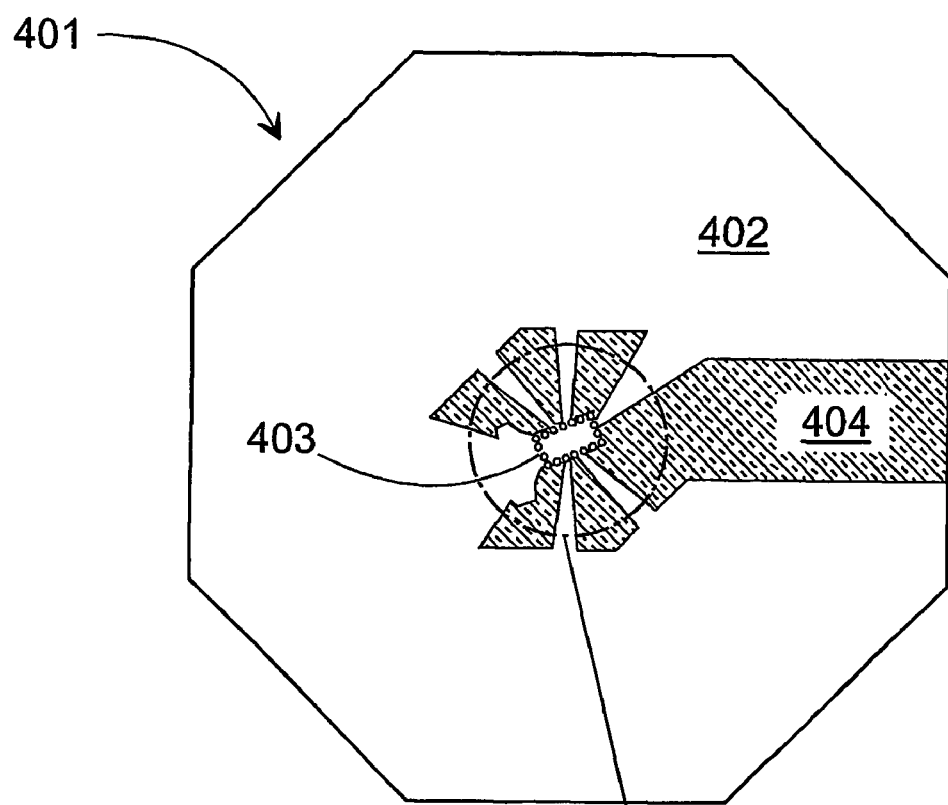
Fig. 4
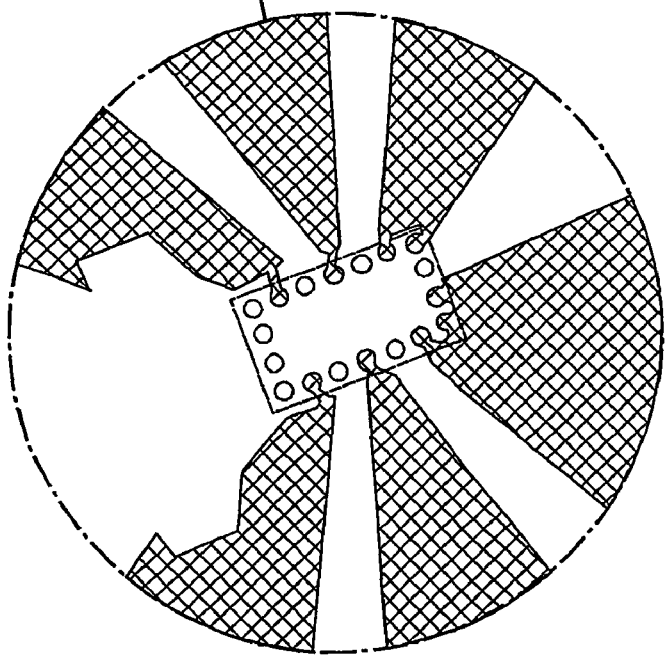

HIGH FREQUENCY INTEGRATED CIRCUIT (HFIC) MICROSYSTEMS ASSEMBLY AND METHOD FOR FABRICATING THE SAME

FIELD OF THE INVENTION

This invention relates to high frequency integrated circuit (HFIC) Microsystems assembly of high aspect ratio trenches and conductors comprising a substrate, a chip, signal paths for power and HF-signals and a grounding structure. Here high frequency is referred to broadband applications and, e.g., frequencies above five gigahertz (5 GHz), in particular. The invention deals also with the method for fabricating the same.

BACKGROUND OF THE INVENTION

The way microwave circuits, patterned metal traces on various microwave substrates, have commercially been packaged for over 30 years utilizing test fixtures and metal housings have to large extend remained the same. Conventional electronic packaging has served the purpose of protecting electronic circuitry in low frequency applications while the package itself is the main cause of degradation in microwave applications. Today, group IV circuits have reached ULSI era and group III-V ICs LSI/VLSI era. Early monolithic ICs brought about the requirement to package ICs in single chip packages while MCMs become common in early 1990's. Today packaging methods are very diversified and often the infrastructure is complex. Until recently, EMS providers or packaging foundries have packaged the ICs, while semiconductor industries have been providing the chips fabricated in clean rooms, where handling of PCBs is difficult. Feature sizes on PCBs have now become many orders of magnitude larger than feature sizes on chips. Thereby, conventional partitioning of electronic packaging has presented a clear conflict in further miniaturizition of HFICs that calls for improved interface between the micro- and macroworlds.

Traditionally common ground on HFIC chip had to be connected to the common ground of the substrate and metal housing through via holes, which tend to be large in size. Advancement in manufacturing technologies has reduced series inductance of via holes. Ideally one wants to connect the common ground on chip directly to the common ground of the assembly without via holes. However, this ideal option has not been presented in the market. Also, typically common ground of HFICs and low frequency ICs has been defined at different potential, making the integration of various ICs in one assembly more difficult.

High frequency integrated circuit (HFIC) packaging has not yet reached the level where monolithic microwave ICs (MMICs) together with low and medium frequency ICs are integrated in a true 3D manner. Drayton et. al., U.S. Pat. No. 5,913,134, Jun. 15, 1999, discuss how passive MICs are created using Si micromachining. These types of circuits can easily be created by using isotropic silicon wet etching, e.g., KOH, 90 degree angle is not maintained and is clearly indicated by drawings. Drayton et. al. work is not suitable for integration of HFICs due to the fact that ICs typically have a large number of points of contacts and thus the substrate structure must become as compact as possible which is not attainable by Si wet etching. In HFICs, HF-signal is typically taken out from the chip differentially. In addition to ground and transmission lines one has to provide power and additionally, e.g., distribution of control signals, divided power and ground planes. Thus, a new type of HFIC microsystems assembly must represent is a clear extension to the formation of HFIC circuitry on chip. Typical MIC layouts are inherently simple in structure while highly integrated compact MMICs have complex structures. Thereby, Drayton's approach is not applicable. Lacking third signal plane and tightly held, large number of IC pads makes Drayton's approach void in this invention. Problems specifically related to HFIC assembly and generic technology in this field is discussed in the following publication: "High Frequency MultiChip Modules—Materials, Design and Fabrication Techniques", Tarja A. Juhola, Royal Institute of Technology, May 2000, ISRN KTH/MVT/FR-00/1-SE, ISSN 0348-4467, TRITA-MVT Report 2000:1.

SUMMARY OF THE INVENTION

It is therefore an object of the present invention to provide high frequency integrated circuit (HFIC) Microsystems assembly of high aspect ratio trenches and conductors and methods for fabricating the same. From fabrication point of view fully planar approach creates an optimal HFIC-assembly of high aspect ratio trenches and conductors that can be manufactured cost-effectively with minimal transmission line losses. The approach makes further miniaturizition of ICs possible: it improves interface between micro- and macro-worlds by enabling remarkable reduction of chip pads in size. The approach enables large area decoupling effects of power and ground on ICs to be transferred onto the assembly substrate. The invention optimizes the area used for interconnects. The method can easily be integrated with IC-processing and make the assembly design process more robust and reliable. Trapped CPW transmission lines used at the chip end enable integration of both group III-V and group IV based circuits in the same assembly.

This invention eliminates most hazardous materials from the assembly making it an environmentally friendly alternative for existing PCB-technologies. This assembly process was aimed specifically for HFIC packaging, but its versatility expands the usage from monolithic microwave integrated circuit (MMIC) packaging to partial PCB assemblies and due to environmental friendliness potentially replacing other PCB techniques especially in high performance applications.

In a preferred method of manufacturing the HFIC-assembly of high aspect ratio trenches and conductors a silicon-on-insulator wafer is used, being suitable for prototyping and small scale production. On the other hand, electroforming in particular, extends the scope of this invention to mass production, being cost effective manufacturing alternative for low frequency systems as well.

All partitioned manufacturing stages: IC-fabrication, electronic packaging and PCB-assembly, can be done in an almost particle free clean room to avoid contamination from the outside and a process mismatch of incompatible materials.

Due to the fact that ICs oftentimes have orders of magnitude larger number of transistors, and much larger number of I/Os in comparison to passive MICs structures (Drayton, et. al.), calls for special assembly approach, e.g., anisotropic Si micromachining. Only DRIE of the semiconductor will be able to create non-deformed right angles in an omnidirectional manner seen from the top creating shortest possible signal paths to the edge of the silicon substrate. Fully planar manufacturing enables chip-to-substrate transition without the use of wirebonding or any type of flipchip bumps or similar materials.

This invention has the advantage of integral passive component integration, through post-processing of ICs and/or embedding filters, inductors, etc. within the assembly. Post-processed ICs are mounted in the same manner as non-Post-processed ICs.

Preferably hermetic cover is used due to the fact that moisture absorption may be a problem at higher frequencies (in 10's of GHz) but even in a few GHz range. The proposed HFIC assembly of high aspect ratio trenches and conductors allows effective hermetic sealing and minimizes electrical discontinuities and transmission losses.

The characteristic features of the HFIC assembly of high aspect ratio trenches and conductors according to the invention are presented in the accompanying claim 1. The preferred methods of making the same are presented in claims 19, 24 and 29.

Further objects, features and advantages of the invention will become apparent from a consideration of the following description and the appended claims when taken in connection with the accompanying drawings.

BRIEF DESCRIPTION OF THE DRAWINGS

The present invention is illustrated by way of example, and not limitation, by figures of the accompanying drawings in which like references indicate similar elements for HFIC assembly of high aspect ratio trenches and conductors in which:

FIG. 4 depicts the adhesion layer applied to the functional part of the second substrate of high aspect ratio trenches and conductors according to another embodiment;

DETAILED DESCRIPTION

High frequency integrated circuit (HFIC) assembly of high aspect ratio trenches and conductors may be used, e.g. in a conventional microwave package assembly or high performance subassembly in a printed circuit board (PCB) or it may itself form a PCB like structure, which eliminates most hazardous materials from the assembly process making it an environmentally friendly alternative for IC assembly purposes. This assembly may contain one or more chips and it can be single or multilevel structure.

Figure 7A:
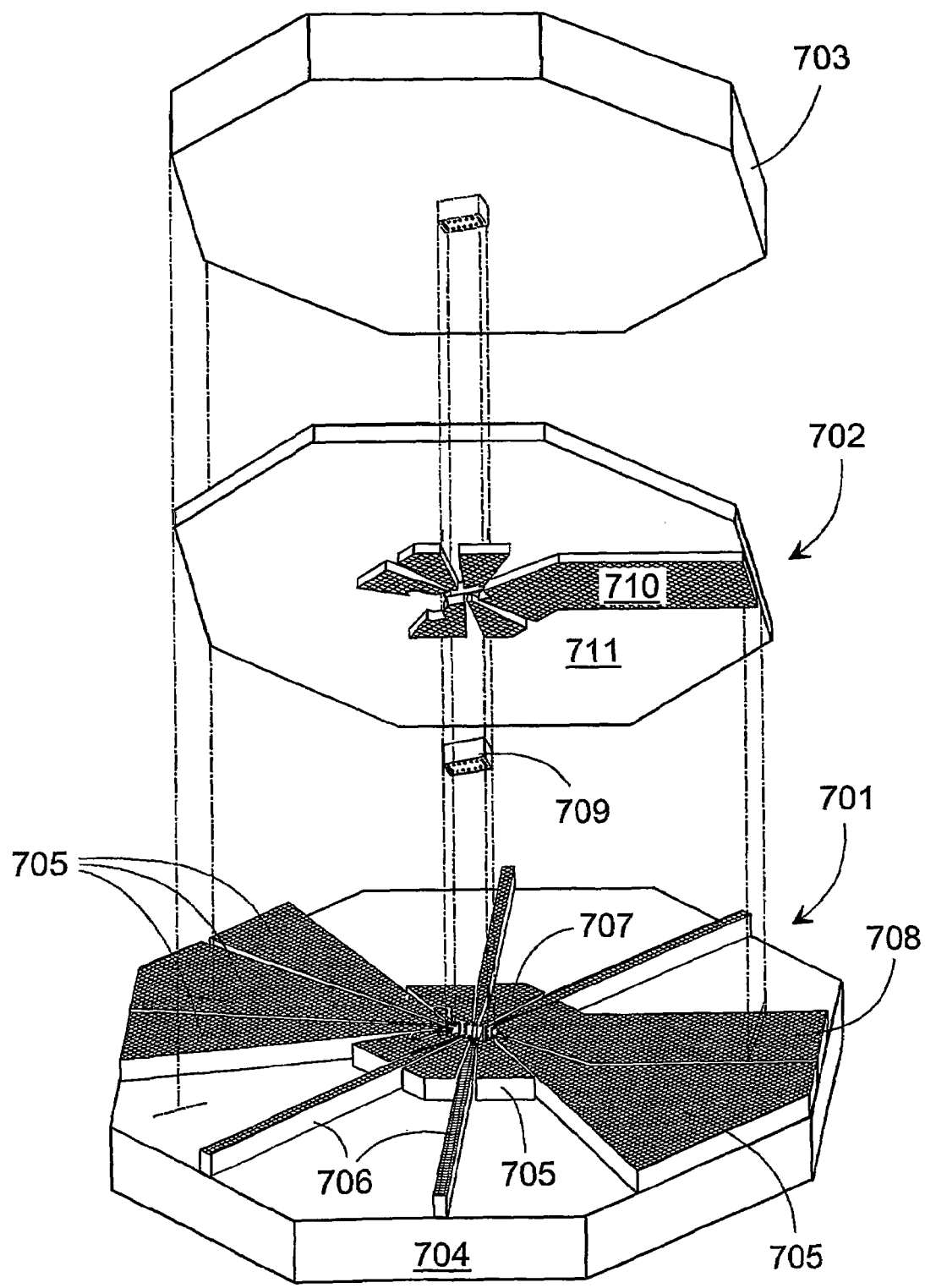
FIG. 7A and FIG. 7B are an exploded axonometric view of the HFIC assembly of high aspect ratio trenches and conductors according to another embodiment.
Figure 7B:
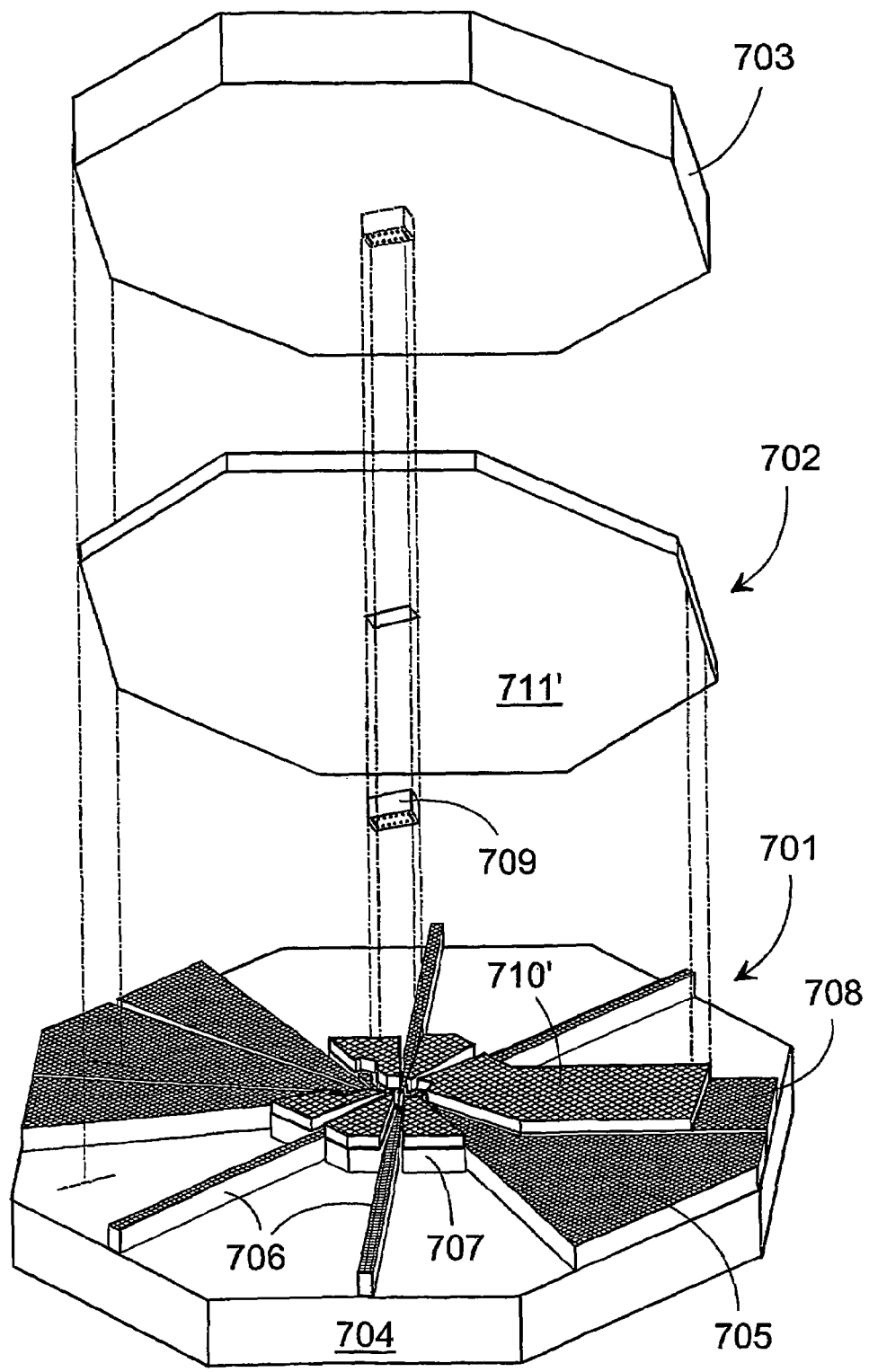
Figure 8:
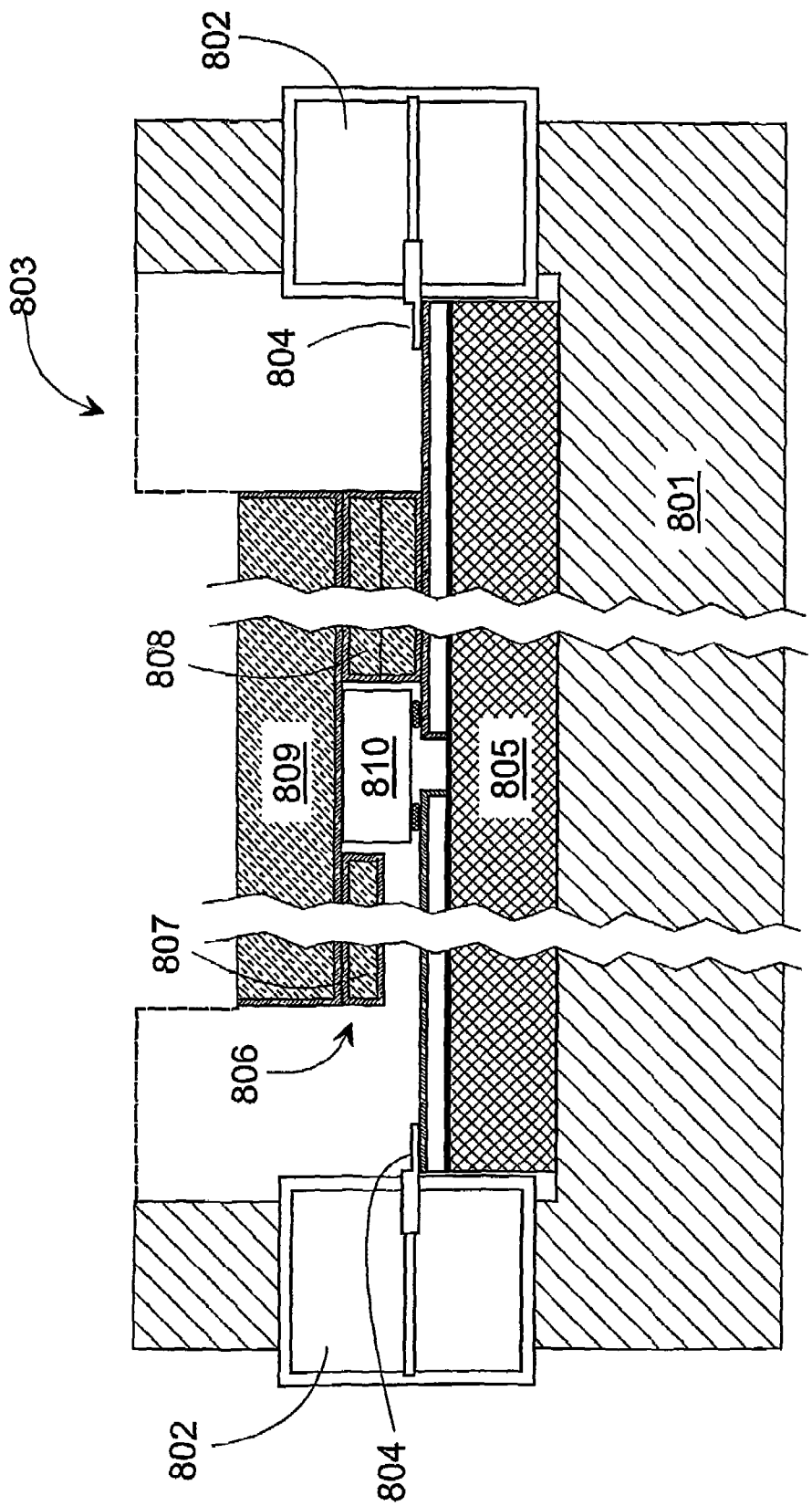
FIG. 8 is a cross sectional view of the HFIC assembly of high aspect ratio trenches and conductors in a conventional microwave package structure according to another embodiment.
Figure 9:
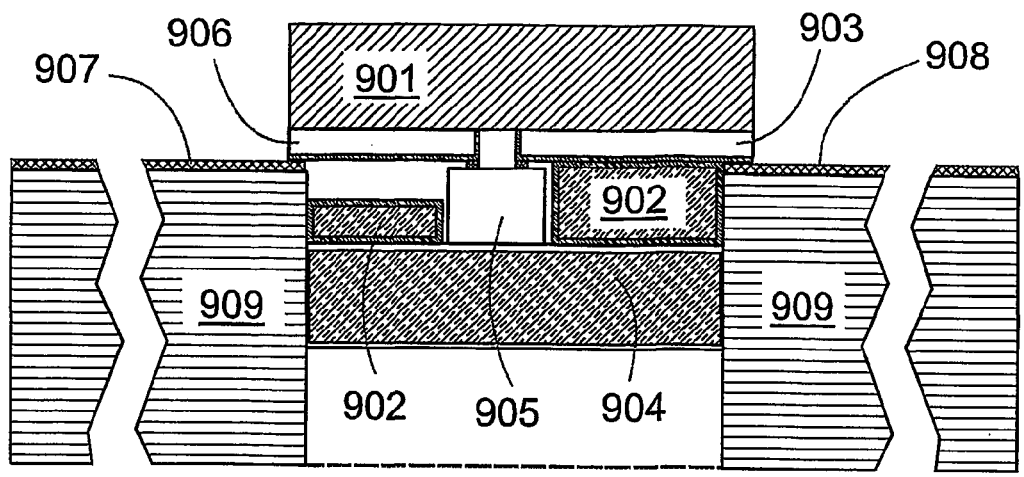
FIG. 9 is a cross sectional view of the HFIC subassembly of high aspect ratio trenches and conductors embedded in a PCB board according to another embodiment.
Figure 10:
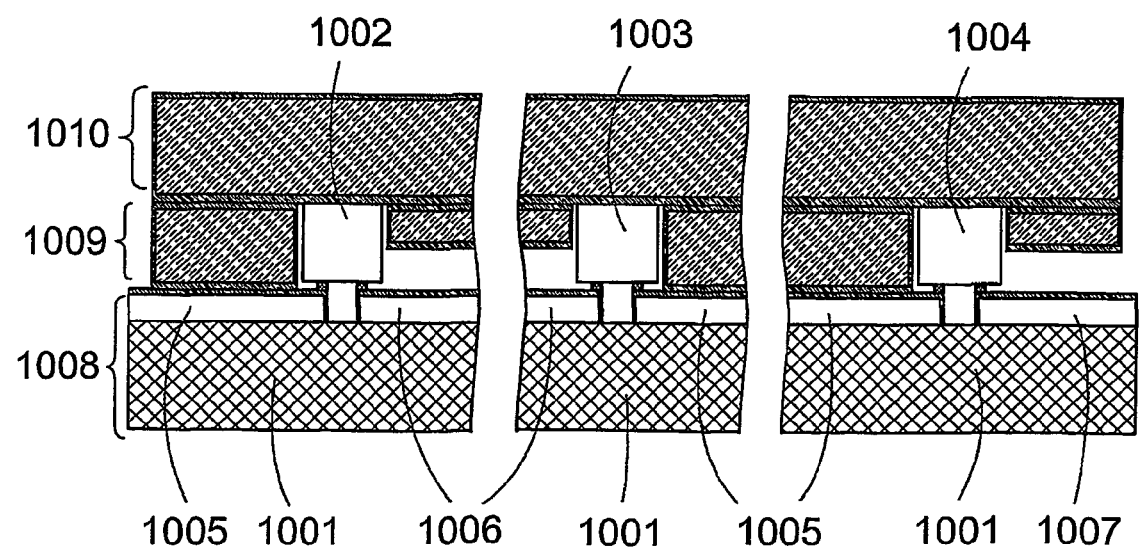
FIG. 10 is a cross sectional view of the HFIC assembly of high aspect ratio trenches and conductors as a PCB board according to another embodiment.

FIGS. 1 through 7 show how one HFIC assembly of high aspect ratio trenches and conductors can be formed and FIGS. 8 through 10 show how HFIC assembly of high aspect ratio trenches and conductors can be realized in a conventional microwave package structure, as a subassembly in a PCB board or can be realized as a PCB board itself.

Figure 1:
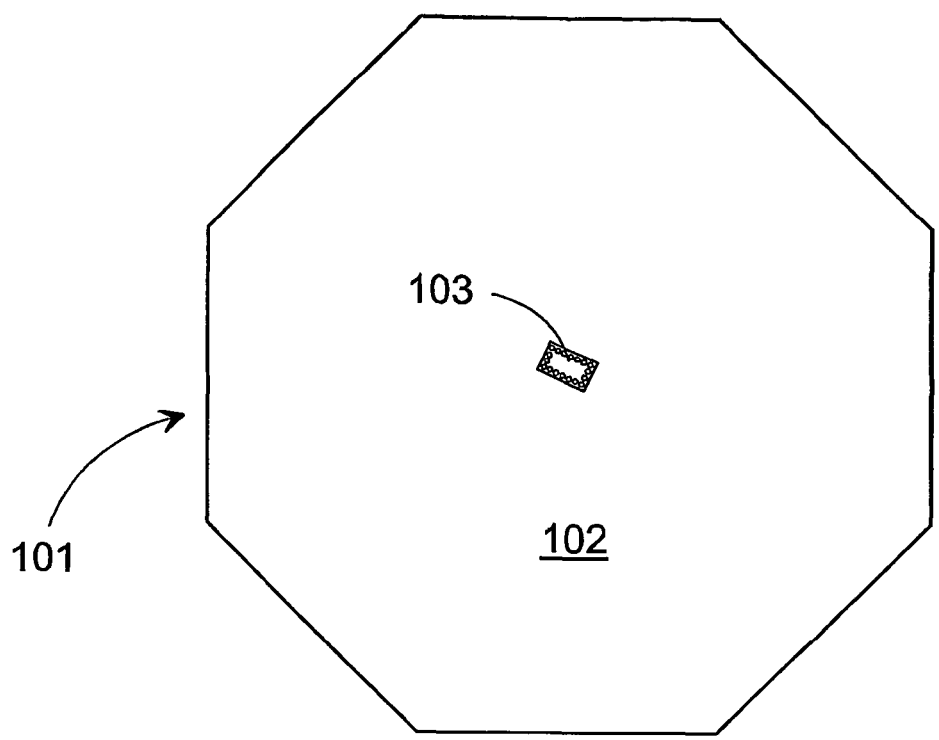
FIG. 1 depicts the functional part of the third substrate with a chip installed therein according to one embodiment.
Figure 2:
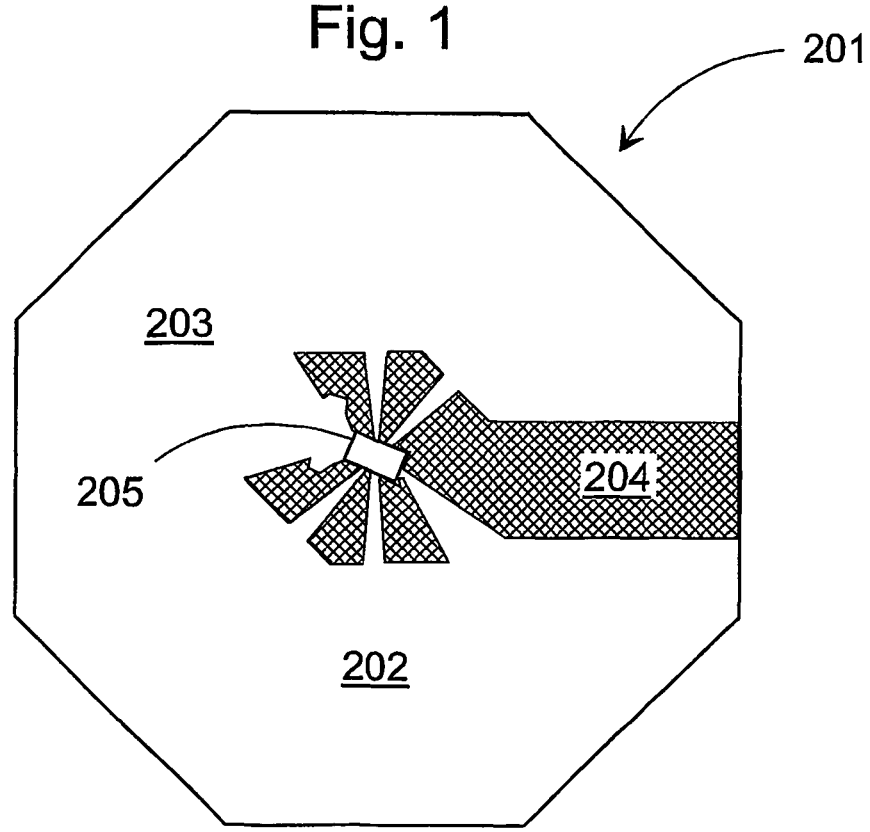
FIG. 2 depicts the functional part of the first substrate seen from the protruding side according to another embodiment.
Figure 3:
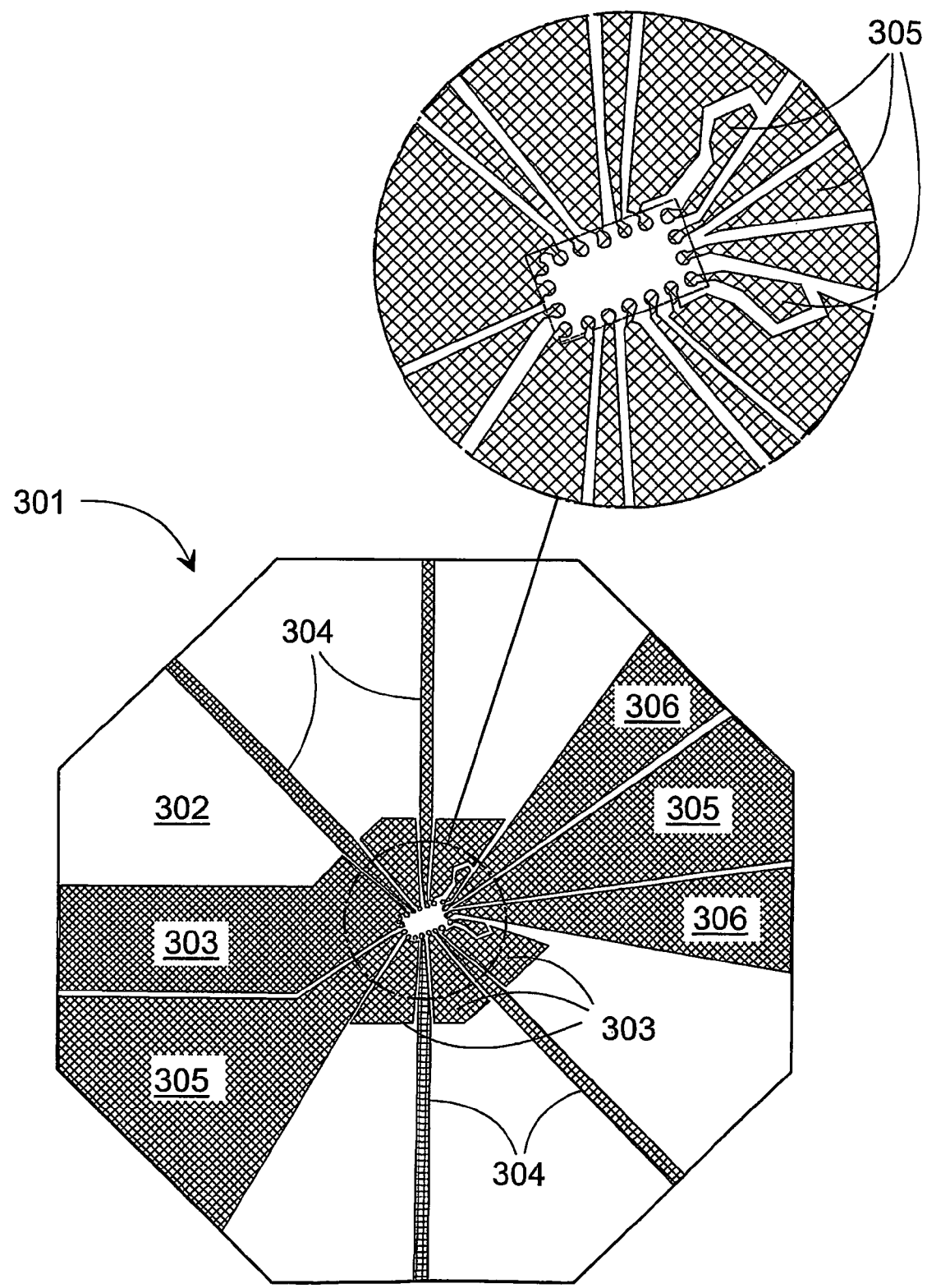
FIG. 3 depicts the functional part of the second substrate of high aspect ratio trenches and conductors seen from the protruding side according to another embodiment.

FIGS. 1 through 3 present main parts of the assembly, which contains a HFIC chip 103, the first substrate 201, the second substrate 301 of high aspect ratio trenches and conductors and the third substrate 101. FIG. 1 shows the functional part 102 of the third substrate 101 and a HFIC chip 103. FIG. 2 shows the functional part 202 of the first substrate 201. FIG. 3 shows the functional part 302 of the second substrate 301 of high aspect ratio trenches and conductors.

In the embodiments shown in FIG. 1 and FIG. 2, the first and third substrates are made into two separate parts. Alternatively the first and the third substrates can be made into one or several parts.

Each of the first, second and third substrates consists of a base part and a functional part. The third substrate 101 consists of an octagonal base part (e.g. 300-2000 um thick) and it is deposited with a layer of metal, for instance copper (e.g. 0.5-3 um thick) to form a functional part 102. Alternatively a metal plate can be used and then there is no need for metal deposition.

The octagonal shape or preferably rounded shape is optimal when the lengths of transmission lines can be the shortest possible for minimum transmission loss. Rectangular or any other shapes can still be used.

In FIG. 2, the functional part 202 of the first substrate 201 has a thru-hole cavity 205 and a protruding common ground area 204 and non-protruding area 203 (e.g. 50-300 um down). Metal layer, e.g. copper, is uniformly deposited onto the functional part. A typical thickness for the base part of the first substrate is in range of 300-600 um.

In FIG. 3 the second substrate 301 of high aspect ratio trenches and conductors is slightly larger than the first substrate 201 in order to let the points of contacts at the edge to be exposed.

FIG. 3 depicts a functional part 302 of the second substrate 301 of high aspect ratio trenches and conductors with conducting signal paths matching a specific chip. For a skilled person it is obvious to apply this invention to any chip or other components. In this example, there are high frequency (HF) signal paths 304, grounding lines 303 power and control lines 305, 306. The typical thickness of the transmission lines at the functional part is preferably in the range of 40-1000 um (generally 20-3000 um). All the signal paths and groundings are conductive and they are naturally isolated from each other. Here the power 305 lines are connected conventionally (inset). Naturally the pattern may be designed to avoid any wire-bonding on the substrate.

The assembly has a minimum of two substrates, however two functional substrates may consist of two or more sub-substrates. In this invention a multi-level structure consists of three or more substrates, which is inherently fully hermetic and characteristically called for in very high frequency applications.

FIG. 4 depicts one way to treat the surface of the functional part 302 of the second substrate 301 of high aspect ratio trenches and conductors, so that the high frequency chip 103 and the functional part 202 of the first substrate 201 can be mechanically and electrically connected to the functional part 302 of the second substrate 301 of high aspect ratio trenches and conductors. Subject 401 is a mask, which has thru-hole openings 404 and 403 on the solid part 402. Subject 401 is aligned to cover the functional part 302 of the second substrate 301 of high aspect ratio trenches and conductors. Conductive adhesive material, e.g. conductive epoxy polymer can be applied through the through hole openings of the subject 401 onto the functional part 302 of the second substrate 301 of high aspect ratio trenches and conductors. Then the HFIC chip 103 and the functional part 202 of the first substrate 201 are aligned and mechanically and electrically connected to the functional part 302 of the second substrate 301 of high aspect ratio trenches and conductors. Other connection methods, including soldering, welding, metallic bonding, etc. can also be used to establish the mechanical and electrical connection described above. Similar connection method is used to connect the base part of the first substrate 201 to the functional part 102 of the third substrate 101.

Figure 5A:
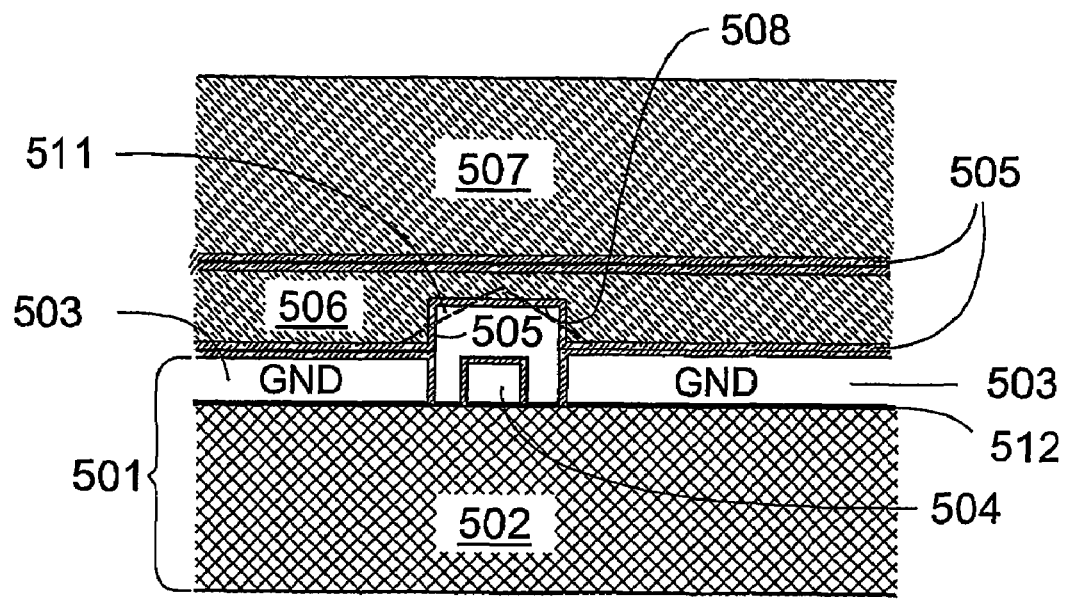
FIG. 5A is a cross sectional view of a transmission line at the chip end according to another embodiment.

FIG. 5A depicts low loss high frequency transmission line structure used at the chip end. Subject 502 is the base part of the second substrate 501 of high aspect ratio trenches and conductors. The functional part of the second substrate 501 of high aspect ratio trenches and conductors comprises of the conductive ground lines 503 and conductive high frequency signal line 504. Subject 506 is the base part of the first substrate 509. The functional part of the first substrate 509 is comprised of a flat surface with a trench 508 in it. The whole first substrate 509 forms a conductive unit, e.g. with a metal layer 505 covering the whole unit. The functional part of the first substrate 509 is aligned, and is then mechanically and electrically connected to the functional part of the second substrate 501 of high aspect ratio trenches and conductors. Conductive ground lines 503 on the functional part of the second substrate 501 of high aspect ratio trenches and conductors now form a common ground with whole first substrate 509. It is essential that the conductors on the second substrate have high aspect ratios but trenches on the first substrate may be fabricated by wet etching to form V-grooves (dotted line 511). Subject 507 is the base part of the third substrate 510. The functional part of the third substrate is a conductive flat surface, which is aligned, and is then mechanically and electrically connected to the base part of the first substrate.

Figure 5B:
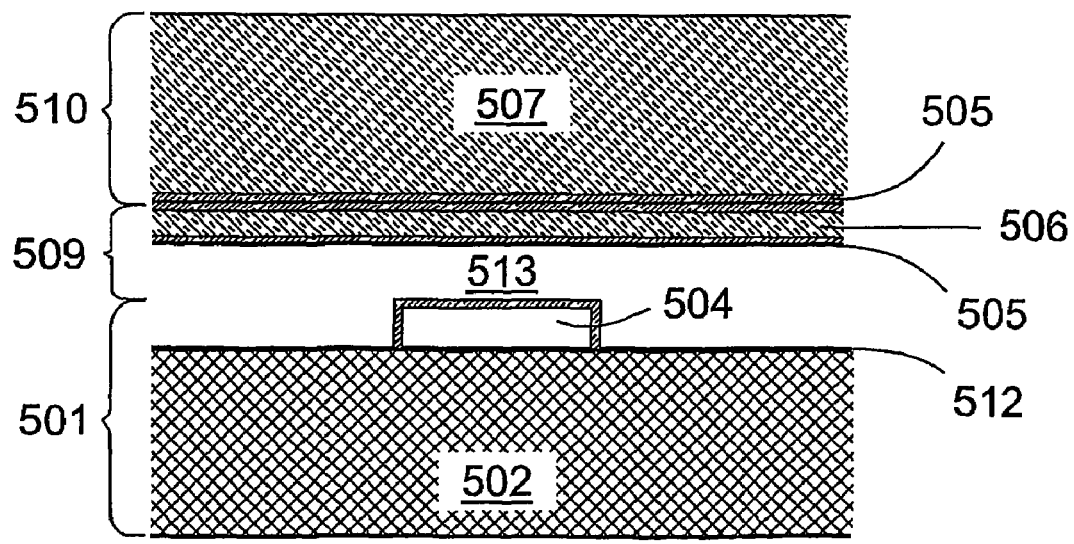
FIG. 5B is a cross sectional view of a transmission line at the connector end according to another embodiment.

FIG. 5B depicts low loss high frequency transmission line structure at the connector end. Subject 502 is the base part of the second substrate 501 of high aspect ratio trenches and conductors. The functional part of the second substrate 501 of high aspect ratio trenches and conductors comprises of conductive high frequency signal line 504. Subject 506 is the base part of the first substrate 509. The functional part of the first substrate 509 is comprised of a flat surface. The whole first substrate 509 forms a conductive unit, e.g. with a metal layer 505 covering the whole unit. The functional part of the first substrate 509 is aligned, and is then mechanically and electrically connected to the functional part of the second substrate 501 through conductive ground lines 503, which is not shown in FIG. 5B. Subject 507 is the base part of the third substrate 510. The functional part of the third substrate is conductive flat surface, which is aligned, and is then mechanically and electrically connected to the base part of the first substrate.

Transition is made from the trapped CPW-structure (FIG. 5A) to the inverted microstrip line (FIG. 5B) at a certain distance from the chip. Usually this distance is about one third of the total length of the transmission line. The CPW-structure makes possible the pad width reduction in size, e.g., to 10 um, when typically 200-400 um and HFIC's 50-75 um. The inverted microstrip is formed with widening conductor 504 on the second substrate 502 and widening trench 508 on the first substrate 509. The final width of the conductor 504 at the edge of the assembly depends on the width of the point of contact, e.g. a connector pin 804 in FIG. 8.

Instead of a "trapped CPW+inverted microstrip" structure a "trapped CPW" or a "trapped CPW+trapped inverted microstrip"—structure could be used.

Figure 6A:
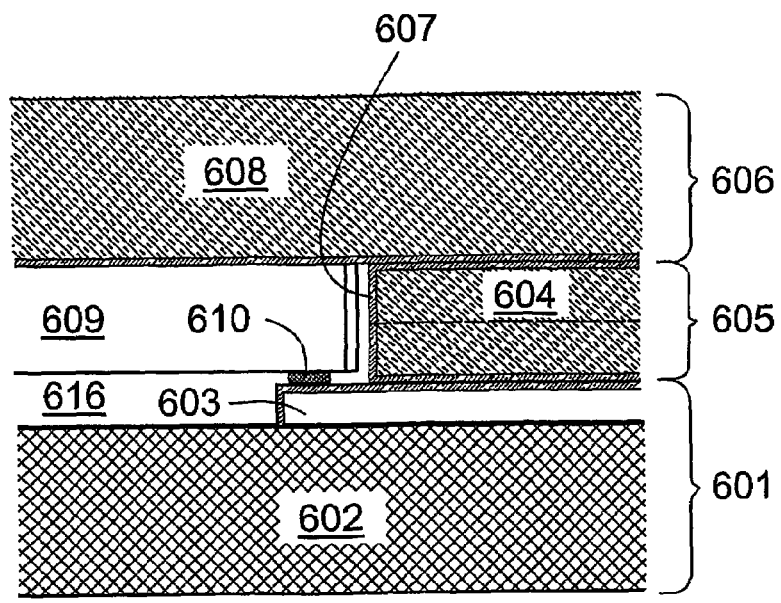
FIG. 6A is a cross sectional view of the common ground at the chip end according to another embodiment.
Figure 6B:
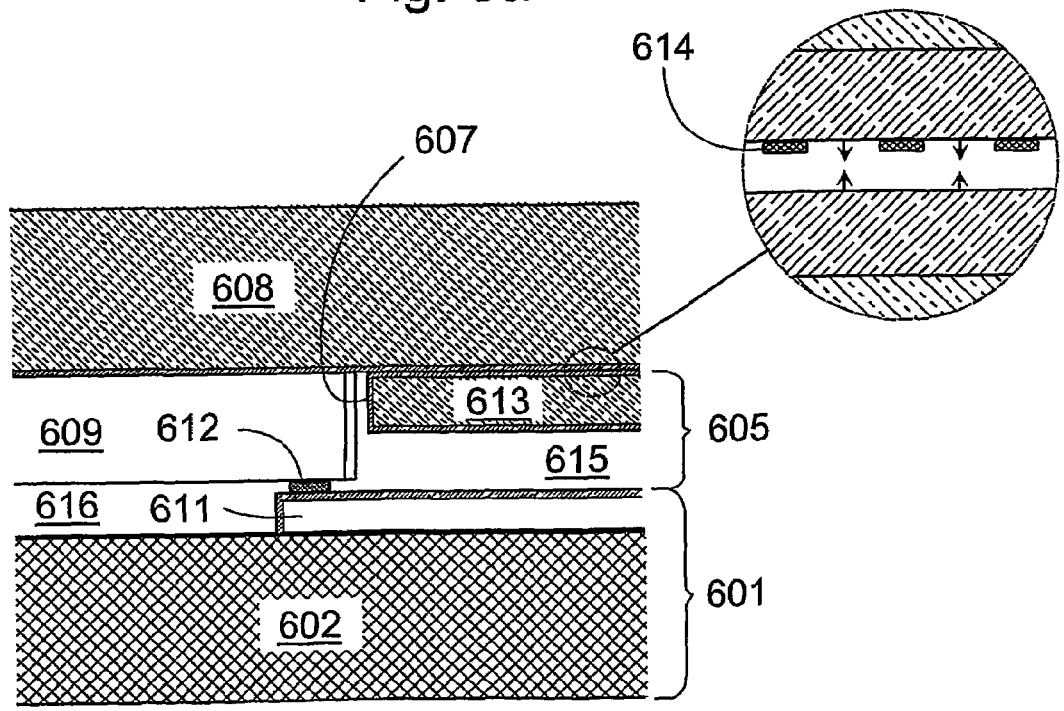
FIG. 6B is a cross sectional view of the connection of the transmission line at the chip end according to another embodiment.

FIGS. 6A and 6B illustrate the chip 609 placement between the second substrate 601, the first substrate 605, and the third substrate 606. Respective reference numbers used in FIGS. 5a and 5b are in brackets.

FIG. 6A illustrates the connection from one ground contact pad 610 of the HFIC chip to the common ground connection of the HFIC assembly of high aspect ratio trenches and conductors. Subject 602 (502) is the base part of the second substrate 601 (501) of high aspect ratio trenches and conductors. The common ground line 603 (503) of the functional part of the second substrate 601 of high aspect ratio trenches and conductors is aligned, and is then mechanically and electrically connected with the common ground on chip 609 through the contact pad 610. Subject 604 (506) is the protruding common ground area of the first substrate 605 (509). The whole first substrate 605 forms a conductive unit, e.g. with a metal layer covering the whole unit. The protruding common ground area 604 of the functional area of the first substrate 605 is aligned, and is then mechanically and electrically connected with the common ground line 603 of the second substrate 601 of high aspect ratio trenches and conductors. Subject 608 (507) is the base part of the third substrate 606 (510). The whole third substrate 606 forms a conductive unit, e.g. with a metal layer covering the whole unit. The functional area of the third substrate 606 is aligned, and is then mechanically and electrically connected with the common ground of the base of the first substrate 605.

FIG. 6B illustrates the connection from one HF-signal or power contact pad 612 of the HFIC chip to the respective signal transmission or power connection of the HFIC assembly of high aspect ratio trenches and conductors. Subject 602 is the base part of the second substrate 601 of high aspect ratio trenches and conductors. The HF-signal or power line 611 (504) of the functional part of the second substrate 601 of high aspect ratio trenches and conductors is aligned, and is then mechanically and electrically connected with the respective HF-signal or power contact pad on chip 609 through the contact pad 612. The air in the cavity 615 (513) forms the best possible dielectric insulator for the signal paths. Subject 613 (506) is the non-protruding common ground area of the first substrate 605. The whole first substrate 605 forms a conductive unit, e.g. with a metal layer covering the whole unit. The functional area of the first substrate 605 is aligned, and is then mechanically and electrically connected with the second substrate 601 of high aspect ratio trenches and conductors, which is not shown in FIG. 6B. Subject 608 is the base part of the third substrate 606. The whole third substrate 606 forms a conductive unit, e.g. with a metal layer covering the whole unit. The functional area of the third substrate 606 is aligned, and is then mechanically and electrically connected with the common ground of the base of the first substrate 605. One way of bonding is presented in inset. The pads 614 increase connection pressure. The pads are comparable to chip pads in size.

In FIGS. 6A and 6B the conductors 603 and 611 extend beyond the cavity of the chip 609, when they are facing the respective pads 610, 612. The air gap 616 at the chip face forms the best possible dielectric insulator.

FIGS. 7A and 7B depict an axonometric view of the HFIC assembly of high aspect ratio trenches and conductors. They illustrate the first substrate 702 (509), the second substrate 701 (501) of high aspect ratio trenches and conductors and the third substrate 703 (510) and the HFIC chip 709 (609) being aligned, and then mechanically and electrically connected together following the description in FIG. 5A through FIG. 6B. In order to expose the points of contacts, the second substrate 701 of high aspect ratio trenches and conductors is larger than the first substrate 702 and the third substrate 703.

In FIG. 7A subject 704 is the base part of the second substrate 701 of high aspect ratio trenches and conductors. Subjects 706 (504) are the HF-signal lines. Subjects 705 are the power or control lines. Subjects 707 (503) and 708 (506, 503) depict the common ground area. Subject 709 is the HFIC chip. Subject 710 depicts protruding common ground area of the first substrate 702. Subject 711 depicts non-protruding common ground area of the first substrate 702. Subject 703 depicts the third substrate. The planar surfaces of subjects 707, 708 and 710, respectively are aligned and connected together. Substrates 702 and 703 are aligned and connected similarly.

In FIG. 7B subject 704 is the base part of the second substrate 701 of high aspect ratio trenches and conductors. Subjects 706 are the HF-signal lines. Subjects 705 are the power or control lines. Subjects 707 and 708 depict the common ground area. Subject 709 is the HFIC chip. Subject 710' depicts protruding common ground area of the second substrate 701 of high aspect ratio trenches and conductors. Subject 711' depicts non-protruding common ground area of the first substrate 702. The protruding common ground area, subject 710' is aligned and connected together with subject 711'. Subject 703 depicts the third substrate. The protruding subjects 710 (FIG. 7a) and 710' (FIG. 7b) raise surfaces of the subjects 711 and 711' from the signal paths 705, 706. Three level substrate presented here is etched in two stages. During the first stage the common ground areas 710' are formed and during the second stage the level of the conductors 705, 706, 708 is formed.

FIG. 8 illustrates a conventional microwave case structure, wherein the HFIC-assembly of high aspect ratio trenches and conductors has been installed according to the invention. The case 801 has connectors 802 on its walls. The cover 803 is not presented, but the enclosed structure is very essential for the common ground. The first substrate 806 and the third substrate 809 are a part of the common ground of the case 801. Subject 805 is the second substrate of high aspect ratio trenches and conductors. Subject 804 is a pin of the connector 802 on the wall of a microwave case structure 801. Subject 810 is the HFIC chip. Subject 807 is the non-protruding common ground area of the first substrate 806. Subject 808 is the protruding common ground area of the first substrate 806.

FIG. 9 depicts that the High Frequency Integrated Circuit (HFIC) assembly of high aspect ratio trenches and conductors is installed onto the PCB board. In FIG. 9, subject 909 is printed circuit board (PCB). Subject 907 is the conductive connection to high frequency signal or power on the PCB board. Subject 908 is the conductive connection to the common ground on the PCB board. Subject 905 is a high frequency integrated circuit chip. Subject 904 is the third substrate of HFIC assembly, while subject 902 is the first substrate. Subject 901 is the base part of the second substrate of high aspect ratio trenches and conductors. On the functional part of the second substrate of high aspect ratio trenches and conductors subject 906 is the transmission line for high frequency signal or power and subject 903 is the common ground line. This technology is applicable also for lower frequencies and provides environmentally friendly manufacturing.

FIG. 10 depicts that printed circuit board (PCB) directly serves as the second substrate of high aspect ratio trenches and conductors of the High Frequency Integrated Circuit (HFIC) assembly of high aspect ratio trenches and conductors. High frequency integrated circuits 1002, 1003 and 1004 are directed installed onto the PCB board without additional packaging. PCB board substrate 1001 serves as the base parts for the second substrates of HFIC assemblies of high aspect ratio trenches and conductors. Subjects 1006 and 1007 are the transmission lines on the PCB board for high frequency signals or power/control. Subjects 1005 are the common ground lines. Subject 1008 is the second substrate of HFIC assemblies of high aspect ratio trenches and conductors comprising PCB board and the conductive lines on the PCB board. Subject 1009 is the first substrate and subject 1010 is the third substrate of HFIC assemblies of high aspect ratio trenches and conductors.

At last, it is important to point out all embodiments of high frequency integrated circuit (HFIC) assembly of high aspect ratio trenches and conductors are also applicable to at least one of the following embodiments: low frequency circuit, MEMS component, opt-electronic integrated circuit, optical transmission line or optical fiber assembly. The invention enables also integration of either discrete or integral passive components. This invention removes the limitation of circuit pads at periphery of a chip and known methods of joining a microworld (chip) to a macroworld (PCB). The chip pads and the chip itself may be reduced in size remarkably. This invention makes the post processing of HFIC very advantageous.

Figure 11:
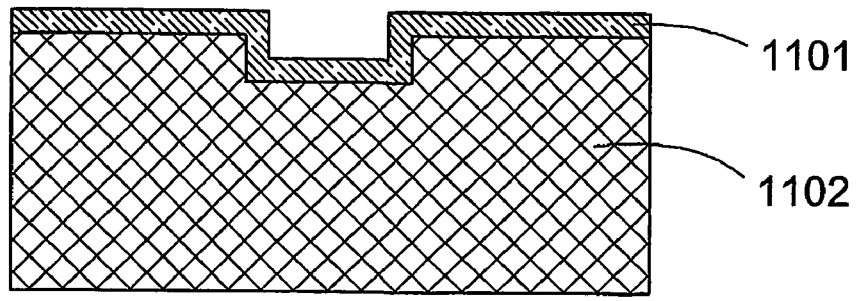
FIG. 11 is cross-sectional side view illustrating process steps to apply photolithography process, etching process and metal deposition process on a silicon wafer to form the first substrate according to another embodiment.

The following embodiments detail three sets of different fabrication techniques to make the first substrate and the second substrate for HFIC assembly of high aspect ratio trenches and conductors. The third substrate can be made the same way as the first substrate. As illustrated in FIG. 11, FIG.

Figure 12A:
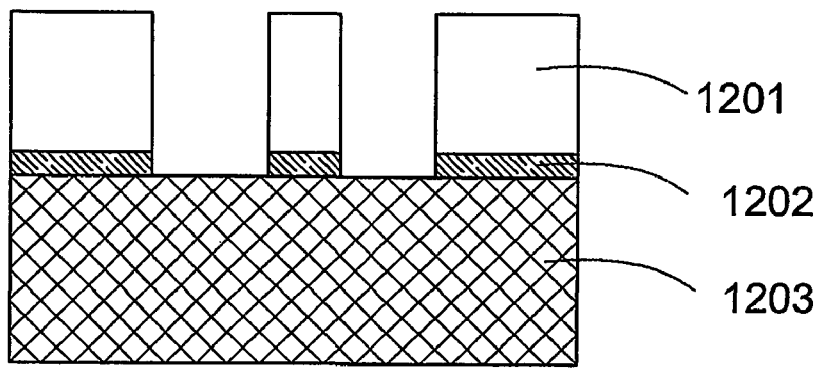
FIG. 12A and FIG. 12B are cross-sectional side views illustrating process steps to apply photolithography process, etching process and metal deposition process on a silicon-on-insulator (SOI) wafer to form the second substrate of high aspect ratio trenches and conductors according to another embodiment.
Figure 12B:
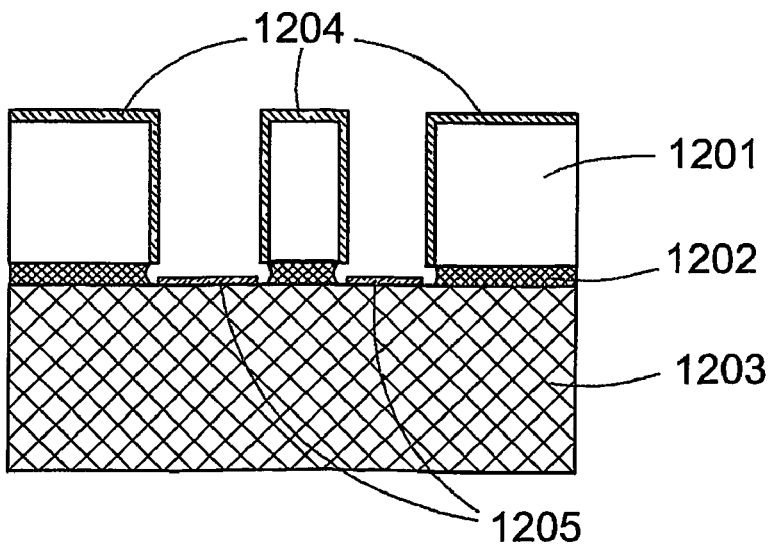

12A and FIG. 12B, the first set of fabrication techniques uses a silicon wafer to make the first substrate, and it uses a silicon-on-insulator (SOI) wafer to make the second substrate of high aspect ratio trenches and conductors.

As illustrated in FIG. 13A, FIG. 13B, FIG. 14A and FIG. 14B, the second set of fabrication techniques uses metal structures or metal-on-insulator (MOI) structures to make both the first substrate and the second substrate of high aspect ratio trenches and conductors.

As illustrated in FIG. 15A, FIG. 15B, FIG. 16A and FIG. 16B, the third set of fabrication techniques uses conductive or non-conductive polymer molding to make both the first substrate and the second substrate of high aspect ratio trenches and conductors.

One preferable fabrication method for a HFIC-assembly of high aspect ratio trenches and conductors having a self supporting integral carrier structure and at least one HFIC-chip comprises the following main steps:

making the first conductive substrate of HFIC assembly of high aspect ratio trenches and conductors having at least one chip recess;

making the second substrate of high aspect ratio trenches and conductors of HFIC assembly of high aspect ratio trenches and conductors with semiconductor-on-insulator (SOI) wafer;

installing a HFIC chip on the second substrate of high aspect ratio trenches and conductors bonding of the first and second substrates.

FIG. 11 illustrates that a silicon wafer is fabricated to become the first substrate. Silicon wafer substrate 1102 is first patterned and then etched selectively from certain areas. Then a metal layer 1101 is deposited onto the silicon surface. The patterning is normally done with photolithographic process commonly used in silicon microfabrication industry. The etching is normally done by wet chemical etching or deep reactive ion etching (DRIE), i.e., dry etching. The metal layer 1101 can be deposited, e.g. by sputtering, evaporation, electroplating, electroforming, electroless deposition etc..

FIG. 12A and FIG. 12B address the fabrication techniques to make the second substrate of high aspect ratio trenches and conductors for HFIC assembly of high aspect ratio trenches and conductors with SOI wafer. Referring to FIG. 12A, the top layer silicon 1201 and the middle silicon dioxide layer 1202 of the SOI wafer are patterned and etched. The patterning is normally done with photolithographic process commonly used in silicon microfabrication industry. The etching is preferably done with reactive ion etching (DRIE). The substrate of SOI wafer 1203 is normally not processed.

Referring to FIG. 12B, metal layers 1204 and 1205 are deposited onto the SOI wafer. The metal deposition is normally done either by sputtering or evaporation process. A photolithographic process and wet chemical etching can be used to ensure metal layers 1204 and 1203 are isolated from each other.

Figure 13A:
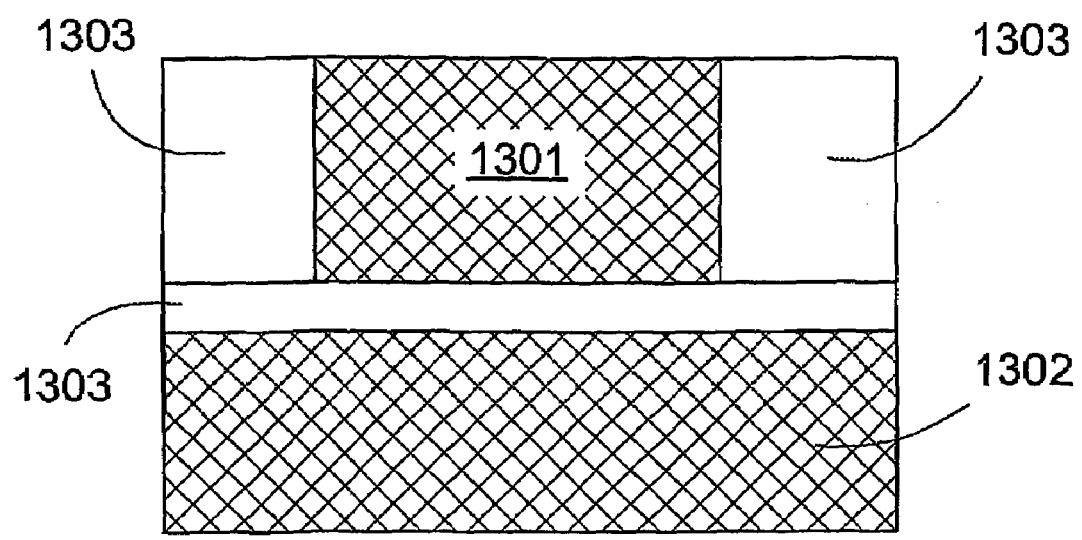
FIG. 13A and FIG. 13B are cross-sectional side views illustrating process steps to apply photolithography process, etching process and metal deposition process on insulator to form the first substrate according to another embodiment.

To make the first substrate for HFIC assembly of high aspect ratio trenches and conductors with metal structures or MOI, FIG. 13A illustrates metal layer 1303 is selectively deposited with sacrificial material 1301 on a metal surface possible on the insulator 1302. The deposition process can be electroplating, electroforming, or electroless plating. A metal structure can be made of Ni, Cu, Ag or Au. A chemical-mechanical-polishing process (CMP) can be used to treat the surface of metal layer 1303. The insulator 1302 can be ceramics, glass, polymeric materials, etc., usually low dielectric constant materials, but in specific cases high dielectric constant materials. In a case of freestanding metal structures a freestanding metal substrate is formed either by removing an insulator 1302 or by processing metal substrate alone.

Figure 13B:
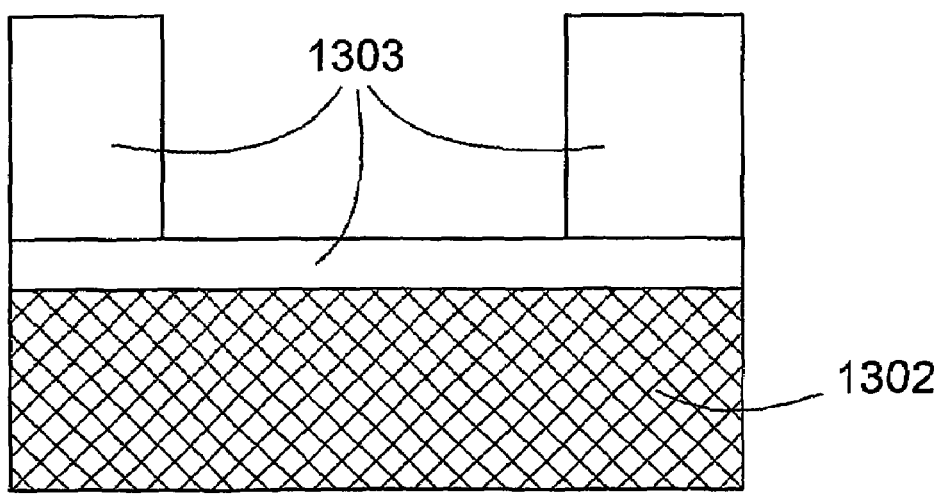

The sacrificial layer 1301 can be metallic or non-metallic. It is then removed with chemical acids or chemical solvents as shown in FIG. 13B.

Figure 14A:
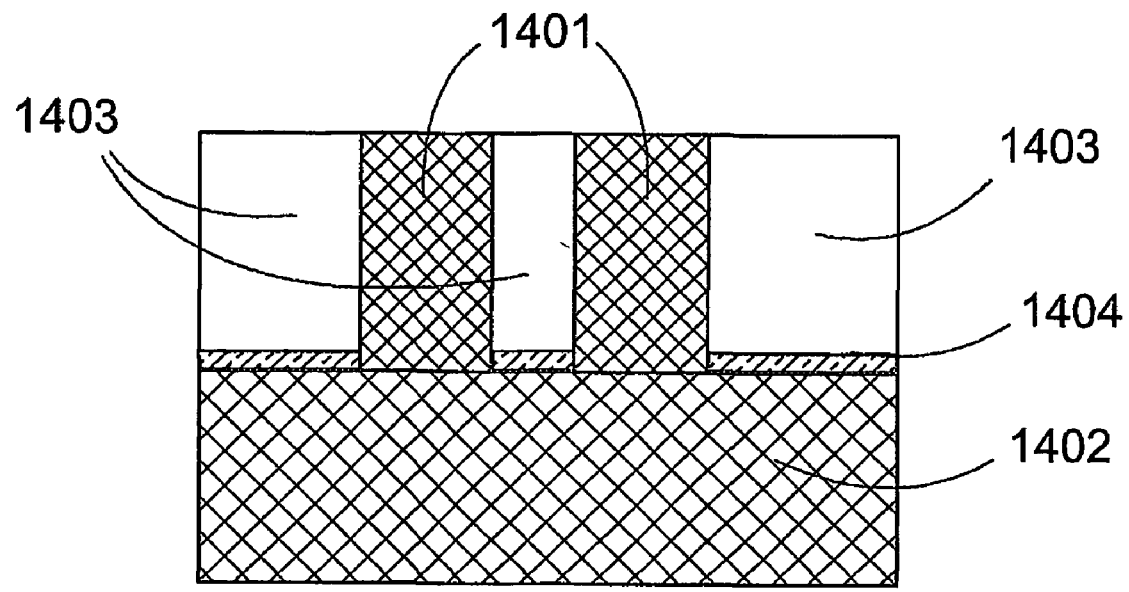
FIG. 14A and FIG. 14B are cross-sectional side views illustrating process steps to apply photolithography process, etching process and metal deposition process on insulator to form the second substrate of high aspect ratio trenches and conductors according to another embodiment.

To make the second substrate of high aspect ratio trenches and conductors for HFIC assembly of high aspect ratio trenches and conductors with metal structures or MOI, FIG. 14A illustrates metal layer 1403 is selectively deposited with sacrificial material 1401 on a seed layer 1404 on the insulator 1402. The deposition process can be electroplating, electroforming, or electroless plating. A metal structure can be made of Ni, Cu, Ag or Au. A chemical-mechanical-polishing process (CMP) can be used to treat the surface of metal layer 1403. The insulator 1402 can be ceramics, glass, polymeric materials, etc., usually low dielectric constant materials, but in specific cases high dielectric constant materials. In a case of freestanding metal structures a sacrificial carrier is used and metal structures are selectively deposited forming high aspect ratio trenches and conductors and a supporting frame after which the sacrificial carrier is removed and the frame is removed after the assembling of the assembly.

Figure 14B:
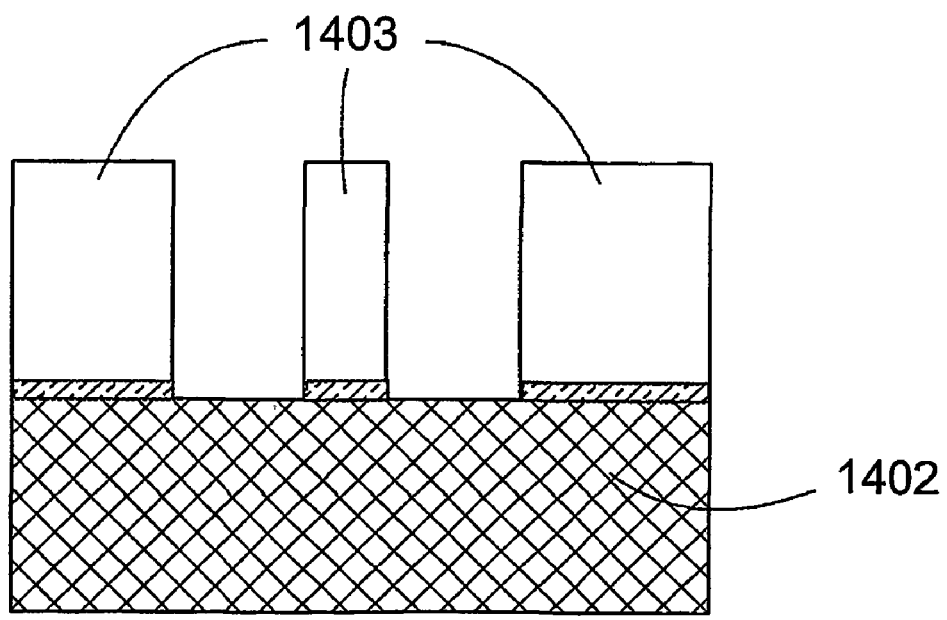

The sacrificial material 1401 can be metallic or non-metallic. It is then removed with chemical acids or chemical solvents as shown in FIG. 14B. In case of metal structures, material 1402 is removed as a sacrificial layer forming freestanding metal structures.

Figure 15A:
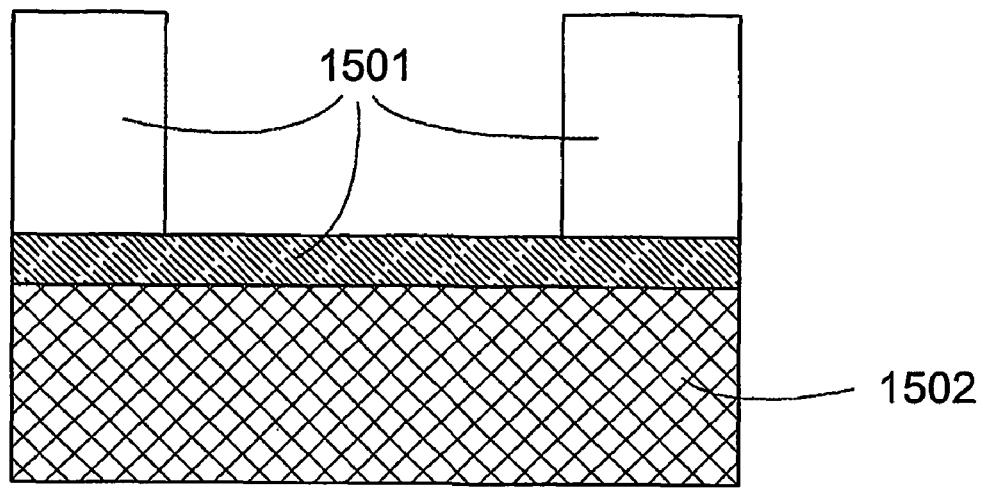
FIG. 15A and FIG. 15B are cross-sectional side views illustrating process steps to apply thermal and mechanical molding process and metal deposition process on conductive or nonconductive polymer on insulator substrate to form the first substrate of high aspect ratio trenches and conductors according to another embodiment.
Figure 15B:
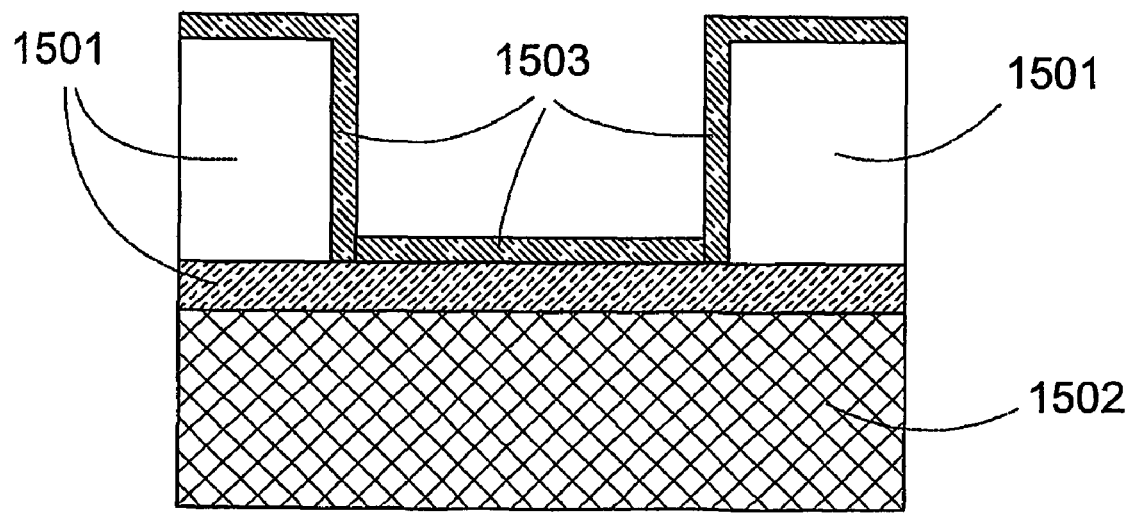

Referring to FIG. 15A, polymeric structure 1501 is thermally and mechanically formed on the insulator 1502 by molding. The insulator can be ceramics, glass, polymeric materials, oxidized silicon wafer, etc. When conductive polymer is used, illustration in FIG. 15A can be the end of the fabrication process to make the first substrate for HFIC assembly of high aspect ratio trenches and conductors. But conductive polymers can also be processed further like non-conductive polymers to have a metal layer 1503 coated as shown in FIG. 15B.

Figure 16A:
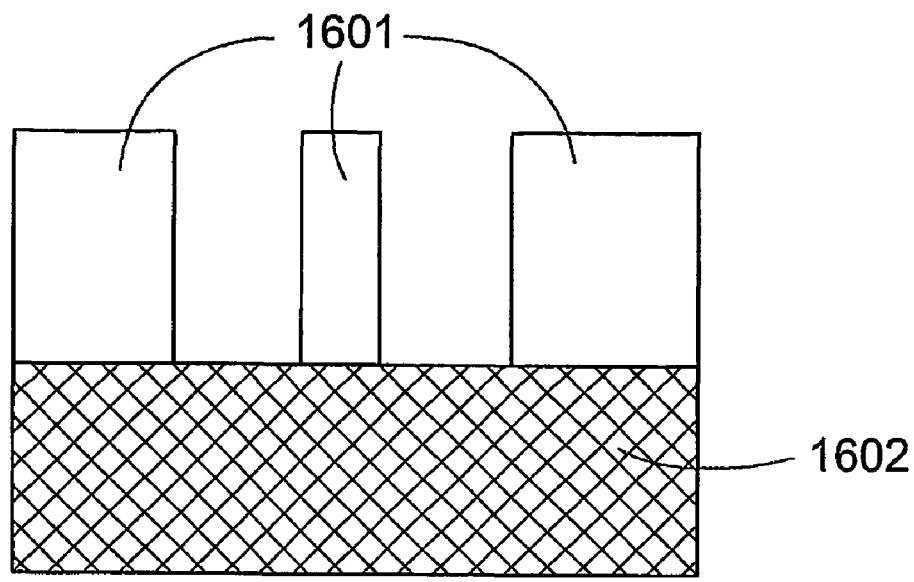
FIG. 16A and FIG. 16B are cross-sectional side views illustrating process steps to apply thermal and mechanical molding process, etching process and metal deposition process on conductive or nonconductive polymer with insulator substrate to form the second substrate of high aspect ratio trenches and conductors according to another embodiment.

Referring to FIG. 16A, polymeric structure 1601 is thermally and mechanically formed on the insulator 1602 by molding. Etching process is also used to ensure the polymer structures are isolated from each other. The etching process can either be wet chemical etching or reactive ion etching (RIE). Polymers tend to be moisture absorbing and thus less suitable for very high frequency applications, however they are very cost effective for lower frequency systems.

Figure 16B:
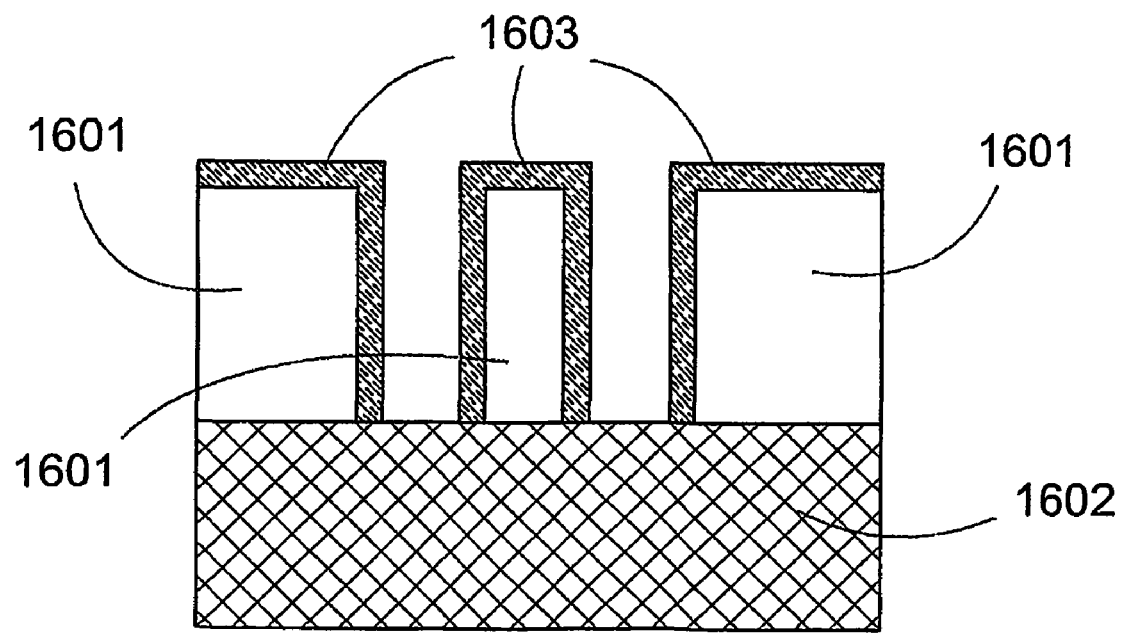

The insulator can be ceramics, glass, polymeric materials, etc. When conductive polymer is used, illustration in FIG. 16A can be the end of the fabrication process to make the second substrate of high aspect ratio trenches and conductors for HFIC assembly of high aspect ratio trenches and conductors. But conductive polymers can also be processed further like non-conductive polymers to have a metal layer 1603 coated as shown in FIG. 16B.

After the first substrate and the second substrate of high aspect ratio trenches and conductors have been fabricated, they can be aligned, and then connected together mechanically, electrically, and thermally, for instance, by conductive adhesive material, soldering, welding, metallic bonding etc.

What is claimed is:

1. Large area planar high frequency integrated circuit (HFIC) assembly comprising: a first substrate (702, 703) having at least one recess for a chip (709) having pads and a chip face and at least one planar surface (710, 711') on the side exposing chip pads and the said substrate being conductive at least at this functional side; a second substrate (701) of conductor-on-insulator having high aspect ratio trenches and conductors (705, 706, 707, 708) comprising planar surfaces (708, 710'), grounding and signal paths for HF- and DC-signals on a functional side arranged to provide connections with chip pads (612), points of peripheral contacts and area for common ground, when assembled in aligned relation to the said planar surfaces (710, 711', 708, 710') of each functional side of the first and second substrates, and the said signal paths and grounding each having a conductor facing the functional side of the first substrate, and the said high aspect ratio conductors increasing the air gap (616) at the chip face; common ground areas (710, 710') between the first and second substrates and these being attached to one substrate and forming shielded cavities (615) for the signal paths (705, 706), and a common ground (707, 708, 710, 710', 711, 711') formed by the first and second substrates encompassing the chip at least adjacent to the HF-signal paths (706); connections between each pad (610, 612) of the chip and the respective signal path (603, 611) of the second substrate.

2. The HFIC assembly of high aspect ratio trenches and conductors according to claim 1, further comprising: a metalized semiconductor, e.g., silicon, as the first substrate.

3. The HFIC assembly of high aspect ratio trenches and conductors according to claim 1, further comprising: a metal structure, e.g., Ni, Cu, Ag, Au as the first substrate.

4. The HFIC assembly of high aspect ratio trenches and conductors according to claim 3, further comprising: the first substrate having a core metal and the metalized layer being more conductive than the core metal.

5. The HFIC assembly of high aspect ratio trenches and conductors according to claim 1, further comprising: a molded conductive or metalized non-conductive polymer as the first substrate.

6. The HFIC assembly of high aspect ratio trenches and conductors according to claim 1, further comprising: a metalized semiconductor-on-insulator as the second substrate of high aspect ratio trenches and conductors.

7. The HFIC assembly of high aspect ratio trenches and conductors according to claim 1, further comprising: a metal-on-insulator (MOI), e.g., Ni, Cu, Ag, Au on insulator as the second substrate of high aspect ratio trenches and conductors.

8. The HFIC assembly of high aspect ratio trenches and conductors according to claim 6 or 7, further comprising: a high dielectric constant material as the insulator.

9. The HFIC assembly of high aspect ratio trenches and conductors according to claim 6 or 7, further comprising: a low dielectric constant material as the insulator.

10. The HFIC assembly of high aspect ratio trenches and conductors according to claim 1, further comprising: a free-standing metal as the second substrate of high aspect ratio trenches and conductors.

11. The HFIC assembly of high aspect ratio trenches and conductors according to claim 1, further comprising: an inverted trapped dual mode structure as the HF-signal path, wherein a trapped coplanar waveguide (CPW) is at the chip end and an inverted microstrip line at the opposite end in order to match the pad width of the chip with an essentially greater width of the point of contact at the opposite end.

12. The HFIC assembly of high aspect ratio trenches and conductors according to claim 1, further comprising: an inverted trapped dual mode structure as the HF-signal path, wherein a trapped coplanar waveguide (CPW) is at the chip end and an inverted trapped microstrip line at the opposite end in order to match the pad width of the chip with essentially greater width of the point of contact in the opposite end.

13. The HFIC assembly of high aspect ratio trenches and conductors according to claim 1, further comprising: an inverted trapped structure as the HF-signal path, wherein a trapped coplanar waveguide (CPW) is formed both at the chip end and at the opposite end in order to match the pad width of the chip with an essentially greater width of the point of contact at the opposite end.

14. The HFIC assembly of high aspect ratio trenches and conductors according to claim 1, wherein the HFIC assembly is applicable to at least one of the following embodiments: low frequency circuit, MEMS component, optoelectronic integrated circuit, optical transmission line or optical fiber assembly.

15. The HFIC assembly of high aspect ratio trenches and conductors according to claim 1, further comprising: a case with a plurality of connectors with its periphery and each connector connected to respective point of contact of the second substrate of high aspect ratio trenches and conductors inside the case.

16. The HFIC assembly of high aspect ratio trenches and conductors according to claim 1, wherein: the HFIC assembly forms a subassembly embedded in a printed circuit board (PCB).

17. The HFIC assembly of high aspect ratio trenches and conductors according to claim 1, wherein the HFIC assembly is used as a stand alone PCB board.

18. The HFIC assembly of high aspect ratio trenches and conductors according to claim 1, further comprising:
making the first conductive substrate of HFIC assembly having at least one chip recess, having pads and a chip face and at least one planar surface (710, 711') on the side exposing chip pads and the said substrate being conductive at least at this functional side;
making the second substrate of high aspect ratio trenches and conductors of HFIC assembly with a semiconductor-on-insulator (SOI) wafer, having high aspect ratio trenches and conductors (705, 706, 707, 708) comprising planar surfaces (708, 710'), grounding and signal paths for HF- and DC-signals on a functional side arranged to provide connections with chip pads (612), points of peripheral contacts and area for common ground, when assembled in aligned relation to the said planar surfaces (710, 711', 708, 710') of each functional side of the first and second substrates, and the said signal paths and grounding each having a conductor facing the functional side of the first substrate, and the said high aspect ratio conductors increasing the air gap (616) at the chip face;
installing a HFIC chip on the second substrate of high aspect ratio trenches and conductors bonding of the first and second substrates.

19. Claim 18 further comprising: the first conductive substrate is made of a semiconductor wafer, which is first patterned and etched, then coated with a metal layer.

20. Claim 18 further comprising: the semiconductor-on-insulator wafer is first patterned and etched to form high aspect ratio trenches and conductors having face and side surfaces as well as bottom surfaces between them.

21. Claim 20 further comprising: at least face and side surfaces are coated with a metal layer.

22. Claim 20 further comprising: the bottom surfaces are also coated with a metal layer.

23. The HFIC assembly of high aspect ratio trenches and conductors according to claim 1, further comprising:
making the first conductive substrate of HFIC assembly having at least one chip recess, having pads and a chip face and at least one planar surface (710, 711') on the side exposing chip pads and the said substrate being conductive at least at this functional side;
making the second substrate of high aspect ratio trenches and conductors of HFIC assembly with a polymer-oninsulator carrier, having high aspect ratio trenches and conductors (705, 706, 707, 708) comprising planar surfaces (708, 710'), grounding and signal oaths for HF- and DC-signals on a functional side arranged to provide connections with chip pads (612), points of peripheral contacts and area for common ground, when assembled in aligned relation to the said planar surfaces (710, 711', 708, 710') of each functional side of the first and second substrates, and the said signal paths and grounding each having a conductor facing the functional side of the first substrate, and the said high aspect ratio conductors increasing the air a (616) at the chip face;

installing a HFIC chip on the second substrate of high aspect ratio trenches and conductors;

bonding of the first and second substrates.

24. Claim 23 further comprising: making the first substrate of HFIC assembly of high aspect ratio trenches and conductors with thermal and mechanical molding of conductive or non-conductive polymers-on-insulator.

25. Claim 23 further comprising: making the second substrate of high aspect ratio trenches and conductors of HFIC assembly with thermal and mechanical molding, as well as etching of conductive and non-conductive polymers-on-insulator.

26. Claim 23 further comprising: a metal layer coating is to be deposited on non-conductive polymer.

27. Claim 23 further comprising: a metal layer coating is used for conductive polymers to improve the conductivity at the surface.

28. The HFIC assembly of high aspect ratio trenches and conductors according to claim 1, further comprising:

making the first conductive substrate of HFIC assembly having at least one chip recess, having pads and a chip face and at least one planar surface (710, 711') on the side exposing chip pads and the said substrate being conductive at least at this functional side;

making the second substrate of high aspect ratio trenches and conductors of HFIC assembly with a metal-on-insulator carrier, having high aspect ratio trenches and conductors (705, 706, 707, 708) comprising planar surfaces (708, 710'), grounding and signal paths for HF- and DC-signals on a functional side arranged to provide connections with chip pads (612), points of peripheral contacts and area for common ground, when assembled in aligned relation to the said planar surfaces (710, 711', 708, 710') of each functional side of the first and second substrates, and the said signal paths and grounding each having a conductor facing the functional side of the first substrate, and the said high aspect ratio conductors increasing the air gap (616) at the chip face;

installing a HFIC chip on the second substrate of high aspect ratio trenches and conductors bonding of the first and second substrates.

29. Claim 28 further comprising: the first substrate is a metal carrier or a metal carrier on insulator.

30. Claim 28 further comprising: the insulator is used and metal structures are selectively deposited on the insulator forming high aspect ratio trenches and conductors.

31. Claim 28 further comprising: the sacrificial carrier is used and metal structures are selectively deposited forming high aspect ratio trenches and conductors and a supporting frame after which the sacrificial carrier is removed and the frame is removed after the assembling of the assembly.

32. Claim 28 further comprising: the metal structures are polished by chemical-mechanical-polishing (CMP) process.

\* \* \* \* \*